(12) United States Patent
Sato et al.

(10) Patent No.: US 12,078,922 B2
(45) Date of Patent: Sep. 3, 2024

(54) TEMPLATE, WORKPIECE, AND ALIGNMENT METHOD

(71) Applicant: Kioxia Corporation, Tokyo (JP)

(72) Inventors: Takashi Sato, Kanagawa (JP); Takeshi Suto, Kanagawa (JP); Satoshi Mitsugi, Kanagawa (JP)

(73) Assignee: Kioxia Corporation, Tokyo (JP)

( * ) Notice: Subject to any disclaimer, the term of this patent is extended or adjusted under 35 U.S.C. 154(b) by 337 days.

(21) Appl. No.: 17/472,387

(22) Filed: Sep. 10, 2021

(65) Prior Publication Data

US 2022/0308440 A1 Sep. 29, 2022

(30) Foreign Application Priority Data

Mar. 23, 2021 (JP) ................... 2021-049180

(51) Int. Cl.
| | |
|---|---|
| *G03F 1/42* | (2012.01) |
| *G01B 11/27* | (2006.01) |
| *G03F 7/00* | (2006.01) |
| *G03F 9/00* | (2006.01) |
| *H01L 23/544* | (2006.01) |

(52) U.S. Cl.
CPC ............ *G03F 1/42* (2013.01); *G01B 11/27* (2013.01); *G03F 7/0002* (2013.01); *G03F 9/7042* (2013.01); *H01L 23/544* (2013.01); *H01L 2223/54426* (2013.01); *H01L 2223/54466* (2013.01)

(58) Field of Classification Search
CPC .. G03F 7/70691; G03F 9/7003; G03F 9/7076; G03F 7/0002; G03F 9/7042; G03F 9/7038; G03F 9/7049; G03F 9/7069; H01L 2223/54453; H01L 2223/54426; H01L 23/544
See application file for complete search history.

(56) References Cited

U.S. PATENT DOCUMENTS

| | | | |
|---|---|---|---|
| 9,377,682 B2 | 6/2016 | Kanamitsu et al. | |
| 11,152,218 B2* | 10/2021 | Takakuwa | G03F 9/7038 |
| 11,181,363 B2 | 11/2021 | Yaegashi et al. | |
| 2008/0225254 A1* | 9/2008 | Komine | G03F 9/7076 430/5 |
| 2012/0328725 A1* | 12/2012 | Minoda | G03F 7/0002 425/150 |
| 2014/0061969 A1* | 3/2014 | Okamoto | G03F 7/0002 264/293 |
| 2014/0346694 A1 | 11/2014 | Minoda et al. | |

(Continued)

FOREIGN PATENT DOCUMENTS

| | | |
|---|---|---|
| CN | 111240162 A | 6/2020 |
| JP | 2013-33907 A | 2/2013 |

(Continued)

*Primary Examiner* — Britt D Hanley
*Assistant Examiner* — Victor V Barzykin
(74) *Attorney, Agent, or Firm* — Finnegan, Henderson, Farabow, Garrett & Dunner, LLP

(57) ABSTRACT

A template of one embodiment includes an alignment mark. The alignment mark includes a first main pattern and a first auxiliary pattern. In the first main pattern, a first part and a second part are disposed according to a predetermined repeating pattern. The first auxiliary pattern is configured as a pattern opposite to the repeating pattern in a region outside an end of the first main pattern.

20 Claims, 12 Drawing Sheets

(56) References Cited

U.S. PATENT DOCUMENTS

| | | | |
|---|---|---|---|
| 2017/0040196 A1* | 2/2017 | Takakuwa | G03F 9/7038 |
| 2017/0307367 A1 | 10/2017 | Yaegashi et al. | |
| 2017/0329217 A1* | 11/2017 | Minoda | G03F 7/0002 |
| 2019/0285996 A1* | 9/2019 | Shibayama | B29C 43/04 |
| 2019/0369488 A1 | 12/2019 | Mitsugi | |
| 2020/0301293 A1 | 9/2020 | Mitsugi | |

FOREIGN PATENT DOCUMENTS

| | | |
|---|---|---|
| JP | 5713961 B2 | 5/2015 |
| JP | 2016-143875 A | 8/2016 |
| JP | 2017-204539 A | 11/2017 |
| JP | 2018-22807 A | 2/2018 |
| JP | 2018-98456 A | 6/2018 |
| JP | 2019-24089 A | 2/2019 |
| JP | 2019-212706 A | 12/2019 |
| JP | 2020-154063 A | 9/2020 |
| TW | 201741646 A | 12/2017 |

* cited by examiner

TEMPLATE, WORKPIECE, AND ALIGNMENT METHOD

CROSS-REFERENCE TO RELATED APPLICATIONS

This application is based upon and claims the benefit of priority from Japanese Patent Application No. 2021-049180, filed on Mar. 23, 2021; the entire contents of which are incorporated herein by reference.

FIELD

Embodiments described herein relate generally to a template, a workpiece, and an alignment method.

BACKGROUND

In a manufacturing process of a semiconductor device, an imprint method for forming a fine pattern on a workpiece such as a wafer has been used. In the imprint method, an alignment process is performed to align a template on which the pattern is formed and the workpiece. In the alignment process, an alignment mark provided on each of the template and the workpiece is used. When the alignment mark is irradiated with inspection light, noise due to scattered light may be generated at an end of the alignment mark. In order to improve the alignment accuracy, it is necessary to suppress an influence of noise generated at the end of the alignment mark.

DETAILED DESCRIPTION

According to one embodiment, a template is provided. The template includes an alignment mark. The alignment mark includes a first main pattern and a first auxiliary pattern. In the first main pattern, a first part and a second part are disposed according to a predetermined repeating pattern. The first auxiliary pattern is configured as a pattern opposite to the repeating pattern in a region outside an end of the first main pattern.

Hereinafter, embodiments of the present invention will be described with reference to the drawings. Note that the present invention is not limited to the embodiments. In addition, components in the embodiments include those that can be easily assumed by those skilled in the art or those that are substantially the same.

First Embodiment

<Template>

Figure 1:
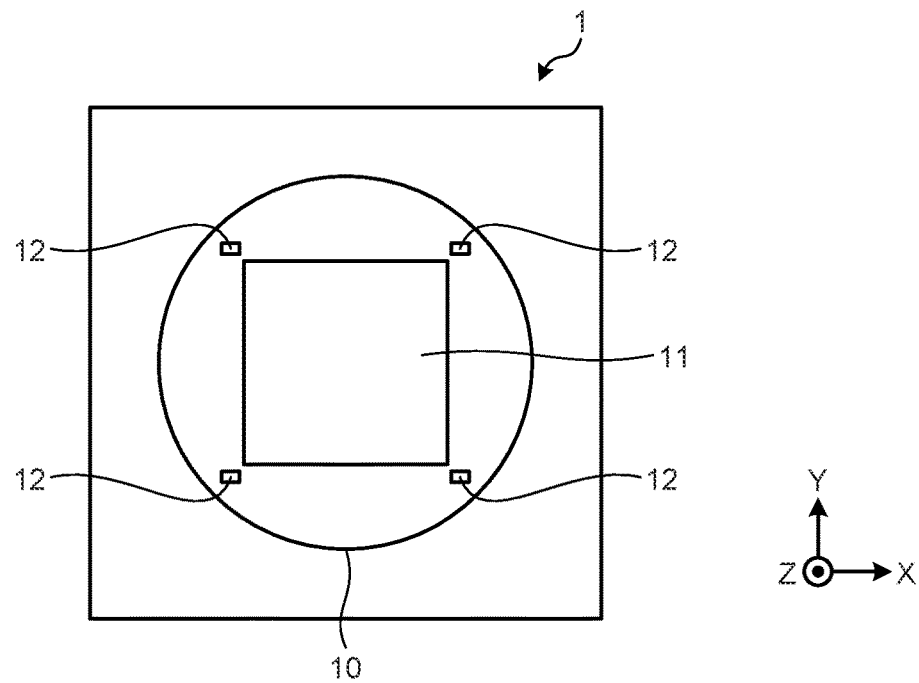
FIG. 1 is a top view illustrating an example of a configuration of a template according to a first embodiment.

FIG. 1 is a top view illustrating an example of a configuration of a template 1 according to a first embodiment. In the figure, an X-axis corresponds to a left-right direction in a horizontal plane, a Y-axis corresponds to a front-back direction in the horizontal plane, and a Z-axis corresponds to a vertical (upward and downward) direction with respect to the horizontal plane.

The template 1 is a plate-like member made of a transparent material that transmits visible light and ultraviolet rays, for example, a material containing quartz as a main component. The template 1 illustrated here has a rectangular shape, for example, is a square having a side length of about 150 mm.

A trapezoidal mesa portion 10 projecting downward is formed at a central portion of the template 1. A device pattern region 11 and an alignment region 12 are formed on a lower surface of the mesa portion 10. Note that even though FIG. 1 illustrates a circular mesa portion 10 in a plan view (top view or bottom view), the mesa portion 10 may be rectangular in a plan view. In the device pattern region 11, a pattern (concave portion or convex portion) to be imprinted on a workpiece is formed.

An alignment mark used for an alignment process for aligning the template 1 and the workpiece is formed in the alignment region 12. Note that the alignment region 12 may be formed in the device pattern region 11.

Figure 2:
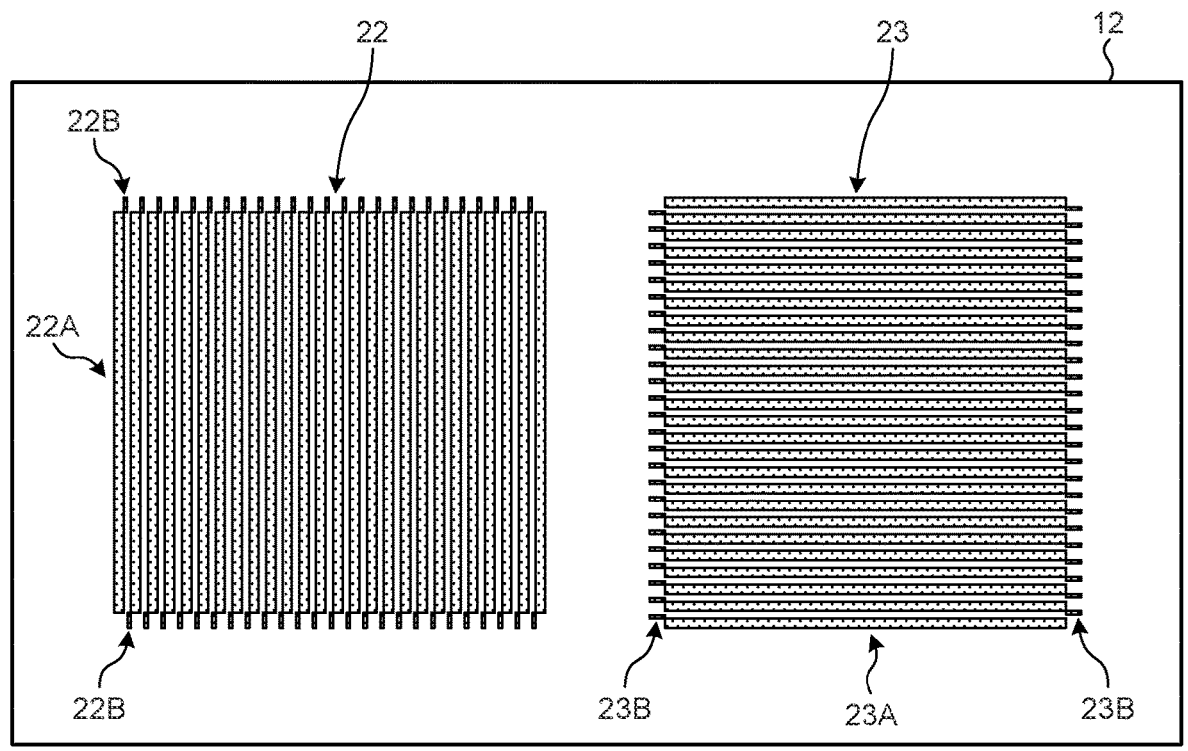
FIG. 2 is a partially enlarged top view illustrating an example of a configuration of an alignment mark region of the template according to the first embodiment.

FIG. 2 is a partially enlarged top view illustrating an example of a configuration of the alignment region 12 of the template 1 according to the first embodiment. A first alignment mark 22 and a second alignment mark 23 are formed in the alignment region 12.

The first alignment mark 22 is a mark for detecting a position shift between the template 1 and the workpiece in an X-axis direction, and includes a first LS pattern 22A (first main pattern) and a first LS auxiliary pattern 22B (first auxiliary pattern).

The first LS pattern 22A is a pattern in which a plurality of linear reflective films that reflects inspection light and linear transmission regions that transmit inspection light are alternately disposed so as to be parallel to the Y-axis, that is, a line-and-space pattern parallel to the Y-axis. For example, the reflective film contains a light-reflecting material such as chromium as a main component.

The first LS auxiliary pattern 22B is a pattern that is formed at an end of the first LS pattern 22A on the Y-axis and has an effect of suppressing noise generated in the vicinity of the end.

The second alignment mark 23 is a mark for detecting a position shift between the template 1 and the workpiece in a Y-axis direction, and includes a second LS pattern 23A (first main pattern) and a second LS auxiliary pattern 23B (first auxiliary pattern).

The second LS pattern 23A is a pattern in which a plurality of linear reflective films that reflects inspection light and linear transmission regions that transmit inspection light are alternately disposed so as to be parallel to the X-axis, that is, a line-and-space pattern parallel to the X-axis.

The second LS auxiliary pattern 23B is a pattern that is formed at an end of the second LS pattern 23A on the X-axis and has an effect of suppressing noise generated in the vicinity of the end.

<Workpiece>

Figure 3:
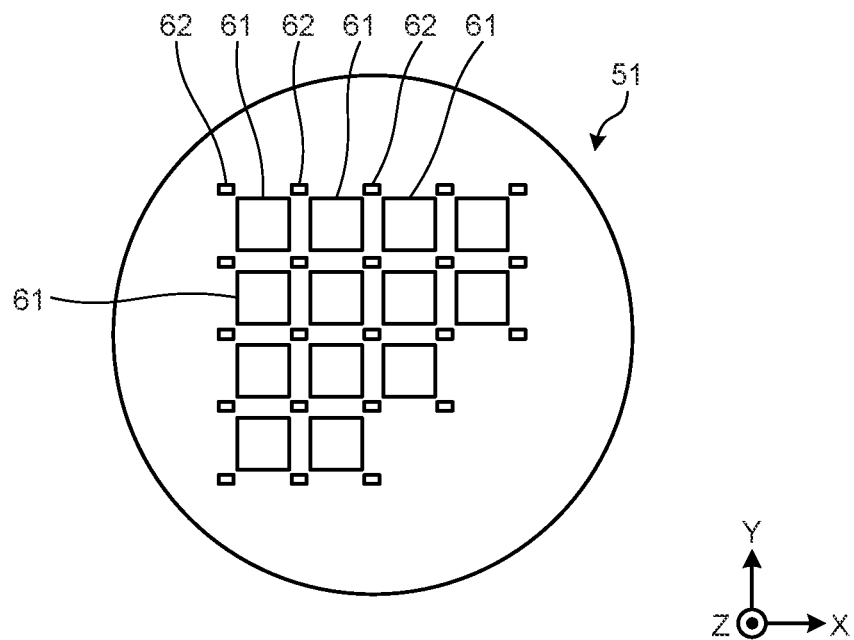
FIG. 3 is a top view illustrating an example of a configuration of a wafer according to the first embodiment.

FIG. 3 is a top view illustrating an example of a configuration of a wafer 51 according to the first embodiment. The wafer 51 is an example of a workpiece processed by an imprint process using the template 1. The wafer 51 may include, for example, a substrate made of silicon, etc., a base pattern formed on the substrate, a processed layer formed on the base pattern, etc. The processed layer may be, for example, an insulating film, a metal film (conductive film), a semiconductor film, etc.

As illustrated in FIG. 3, a plurality of device regions 61 and a plurality of alignment regions 62 are formed on an upper surface (surface to be processed) of the wafer 51 according to the present embodiment.

Each of the device regions 61 is a region in which a predetermined device structure (for example, three-dimensional (3D) NAND, etc.) is formed. In the device region 61, after a predetermined layer (protective layer, resist, etc.) is formed, imprinting by the template 1 is performed. After the predetermined device structure is formed in each of the plurality of device regions 61, a semiconductor device is manufactured by dicing each device region 61 into individual sides.

An alignment mark used for an alignment process for performing alignment between the wafer 51 and the template 1 is formed in the alignment region 62. Note that the alignment region 62 may be formed in the device region 61.

Figure 4:
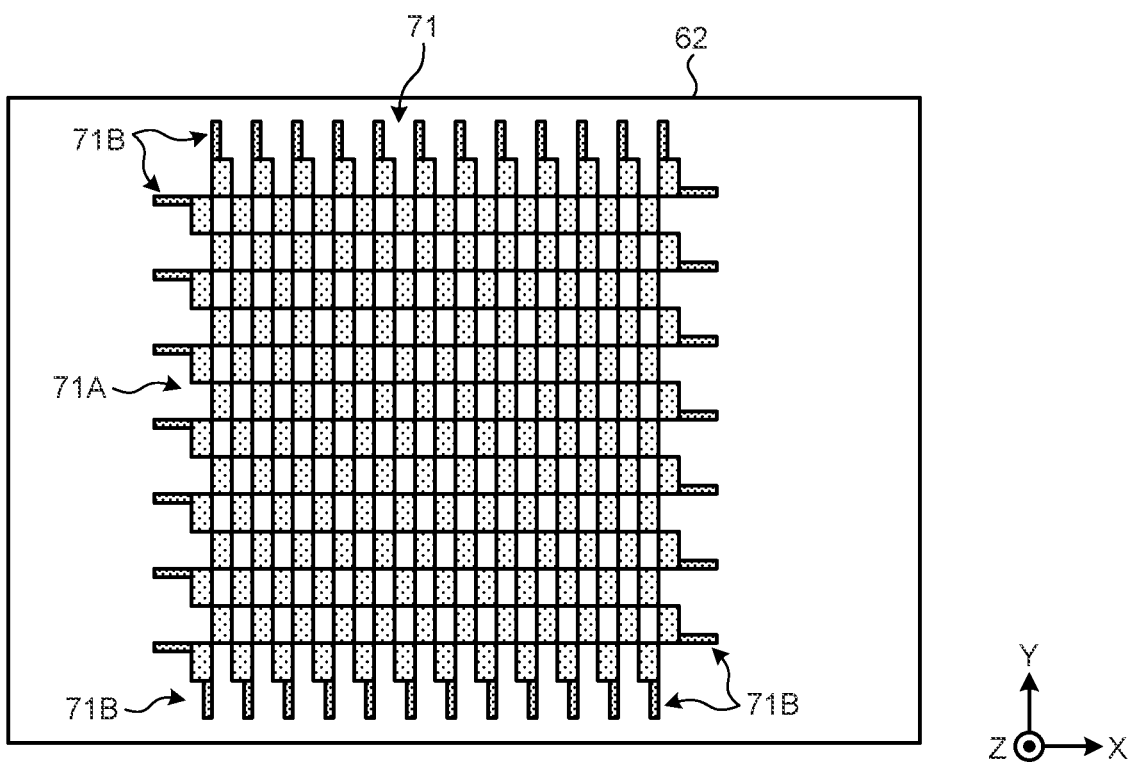
FIG. 4 is a partially enlarged top view illustrating an example of a configuration of an alignment region of the wafer according to the first embodiment.

FIG. 4 is a partially enlarged top view illustrating an example of a configuration of the alignment region 62 of the wafer 51 according to the first embodiment. An alignment mark 71 is formed in the alignment region 62.

The alignment mark 71 formed on the wafer 51 includes a checkered pattern 71A (second main pattern) and a checkered auxiliary pattern 71B (second auxiliary pattern). The checkered pattern 71A is a pattern in which a plurality of rectangular reflective films that reflects inspection light and a plurality of rectangular transmission regions that transmits inspection light are disposed in a checkered shape. The checkered auxiliary pattern 71B is a pattern that is formed at an end of the checkered pattern 71A on the Y-axis and the X-axis and has an effect of suppressing noise generated in the vicinity of the end.

<Alignment Device>

Figure 5:
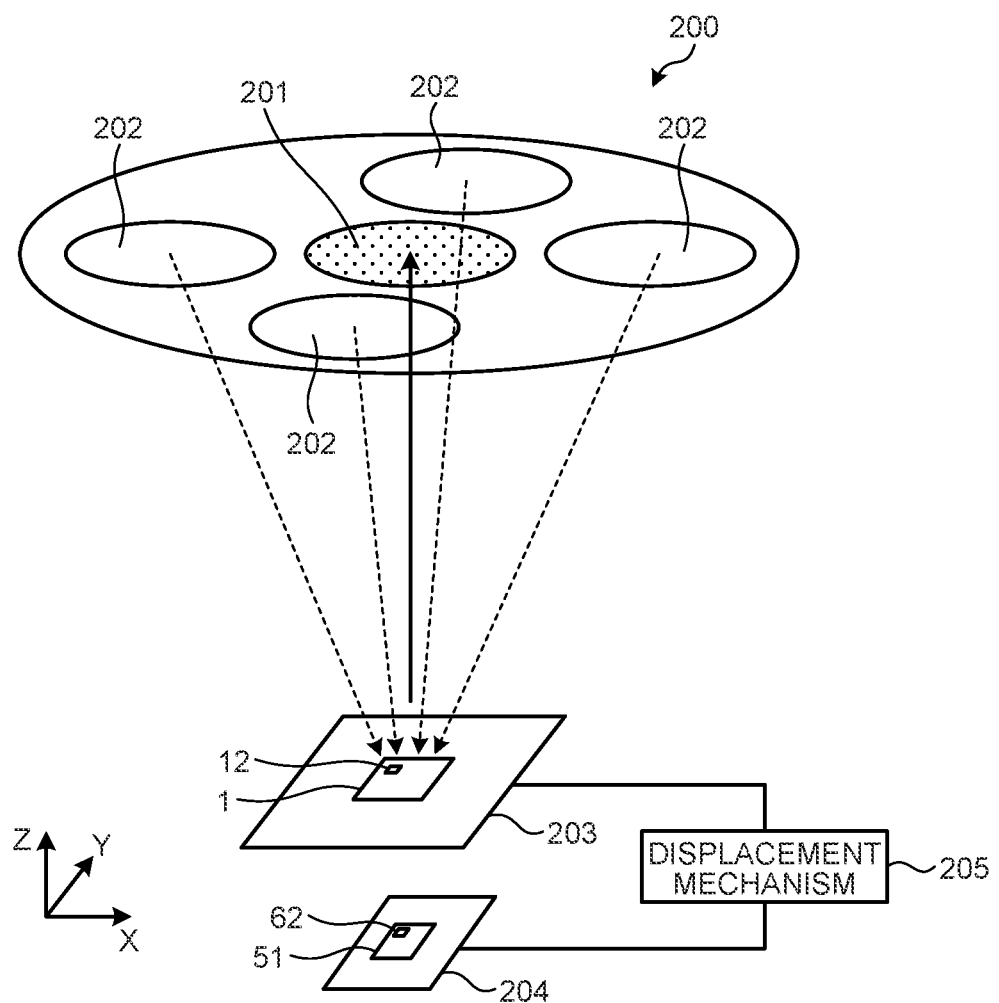
FIG. 5 is a diagram illustrating an example of a configuration of an alignment device according to the first embodiment.

FIG. 5 is a diagram illustrating an example of a configuration of an alignment device 200 according to the first embodiment. The alignment device 200 is a device for aligning the wafer 51 and the template 1, and includes a microscope 201, an illuminator 202, a template holding portion 203, a wafer holding portion 204, and a displacement mechanism 205.

The wafer holding portion 204 holds the wafer 51. The template holding portion 203 holds the template 1 above the wafer 51. The displacement mechanism 205 shifts at least one of the wafer holding portion 204 and the template holding portion 203 to change a relative position of the wafer 51 and the template 1. The illuminator 202 is disposed above the template holding portion 203 and emits inspection light toward the alignment region 12 of the template 1. Inspection light is, for example, light having a wavelength in a visible light region (about 360 nm to about 830 nm). Two of four illuminators 202 are disposed along the X-axis and the other two illuminators 202 are disposed along the Y-axis. The microscope 201 is disposed above the template holding portion 203, and is capable of observing an image (dark field image) of reflected light obtained by inspection light emitted from the illuminator 202 and reflected by the alignment regions 12 and 62. Based on an observation result of the microscope 201, it is possible to obtain information about a moire generated by overlap of the alignment marks 22 and 23 of the template 1 and the alignment mark 71 of the wafer 51.

By turning on the illuminator 202, a part of inspection light emitted from the illuminator 202 passes through the template 1, reaches the first alignment mark 22 or the second alignment mark 23 formed in the alignment region 12, and is diffracted. Any part of diffracted light other than 0th-order light in the diffracted light is incident on the microscope 201. Further, the other part of the inspection light passes through the template 1, reaches the alignment mark 71 formed in the alignment region 62 of the wafer 51, and is diffracted. Any part of the diffracted light other than 0th-order light in this diffracted light is incident on the microscope 201. As a result, the microscope 201 can acquire a dark field image including a moire image generated by overlap of the alignment marks 22, 23, and 71. The displacement mechanism 205 aligns the wafer 51 and the template 1 based on the dark field image (information about moire).

<Alignment Method>

Figure 6:
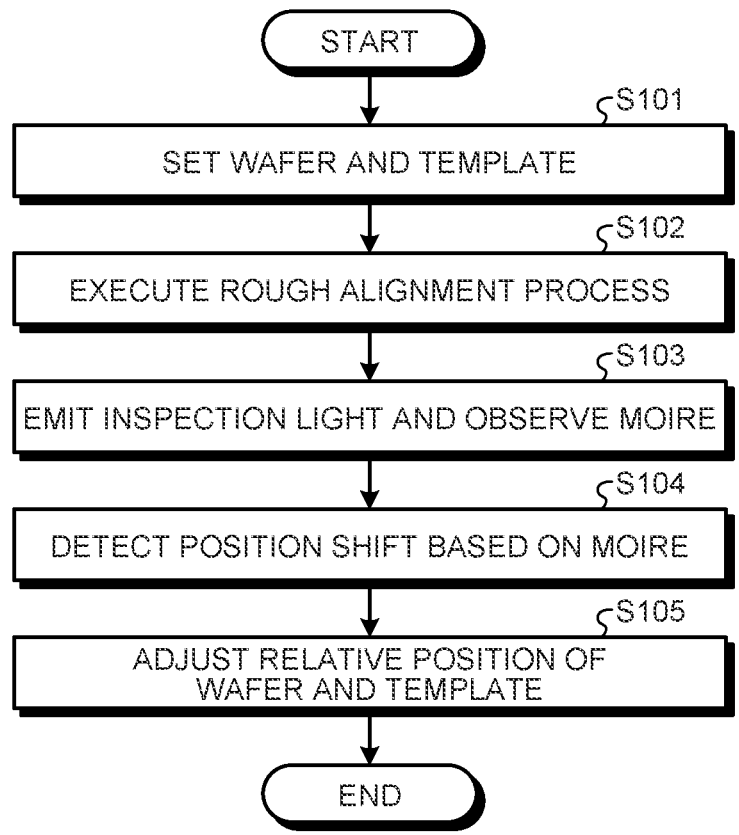
FIG. 6 is a flowchart illustrating an example of an alignment method according to the first embodiment.

FIG. 6 is a flowchart illustrating an example of an alignment method according to the first embodiment. First, the wafer 51 is set on the wafer holding portion 204, and the template 1 is set on the template holding portion 203 (S101). Thereafter, a rough alignment process is executed so that the wafer 51 and the template 1 are disposed at approximately appropriate positions (S102). A specific method of the rough alignment process is not particularly limited, and may be implemented by appropriately using a known technique. The rough alignment process may be performed by using the alignment marks 22, 23, and 71 as described above, or may be performed by using an appropriate mark provided exclusively for the rough alignment process.

Thereafter, a moire that appears by emitting inspection light from an upper surface side of the template 1 toward the alignment region 12 is observed (imaged) using the microscope 201 (S103), and a position shift between the wafer 51 and the template 1 is detected based on a state of the moire (S104). The displacement mechanism 205 adjusts the relative position of the wafer 51 and the template 1 so that the detected position shift is eliminated (S105).

When the alignment method is performed, the first LS auxiliary pattern 22B, the second LS auxiliary pattern 23B, and the checkered auxiliary pattern 71B suppress noise generated at the ends of the first LS pattern 22A, the second LS pattern 23A, and the checkered pattern 71A. In this way, the position shift can be detected with high accuracy, and alignment between the wafer 51 and the template 1 can be executed with high accuracy.

<Configuration Example of LS Auxiliary Pattern>

Figure 7:
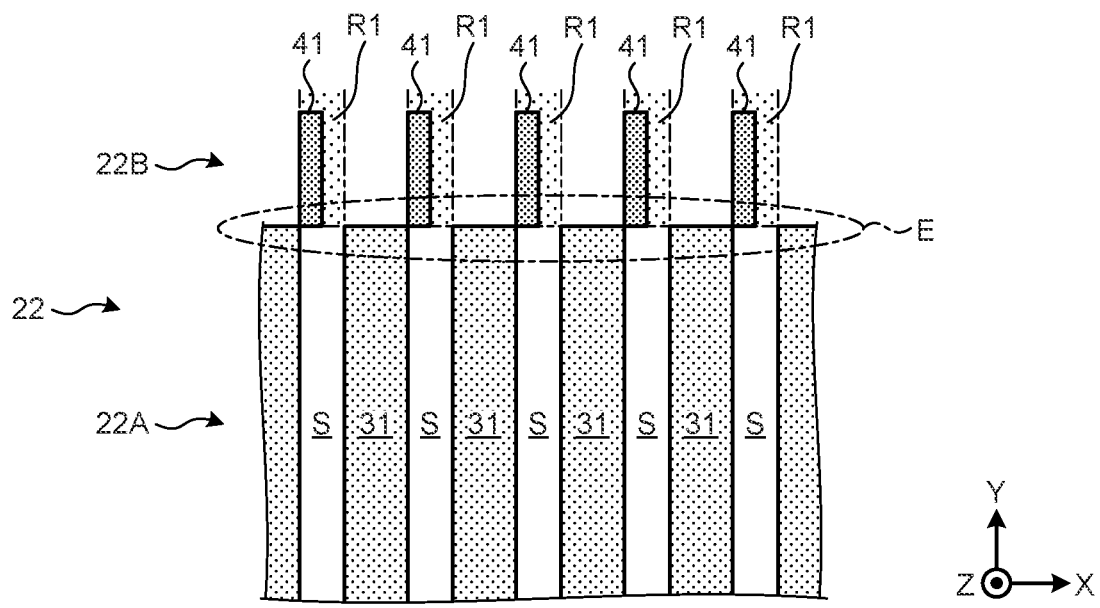
FIG. 7 is a partially enlarged top view illustrating an example of a configuration of a first LS pattern and a first LS auxiliary pattern according to the first embodiment.

FIG. 7 is a partially enlarged top view illustrating an example of a configuration of the first LS pattern 22A and the first LS auxiliary pattern 22B according to the first embodiment. As illustrated in FIG. 7, in the first LS pattern 22A included in a main part of the first alignment mark 22 (see FIG. 2), a plurality of linear reflective films 31 (an example of the first part) is disposed so as to be parallel to the Y-axis. The plurality of reflective films 31 is arranged at equal intervals in the X-axis direction. A plurality of linear transmission regions S (an example of the second part) through which inspection light is transmitted is formed between the plurality of reflective films 31. The first LS pattern 22A is arranged in the X-axis direction in a first period (also referred to as a repeating pattern or a structural period) including the reflective films 31 and the transmission regions S.

The first LS auxiliary pattern 22B is configured as a pattern opposite to the repeating pattern of the first LS pattern 22A in a region outside an end E of the first LS pattern 22A. The first LS auxiliary pattern 22B according to the present embodiment is configured by disposing a plurality of auxiliary films 41 (third part) in a plurality of inversion regions R1, respectively. The auxiliary films 41 include a material that reflects inspection light similarly to the reflective films 31, and may include the same material as that of the reflective films 31, or include a material different from that of the reflective films 31. The plurality of auxiliary films 41 is arranged at equal intervals in the X-axis direction. The first LS auxiliary pattern 22B is arranged in the X-axis direction in a second period (structural period) including a region between an auxiliary film 41 and an adjacent auxiliary film 41. The second period may have the same pitch as that of the first period. The inversion region R1 is a region outside the end E of the first LS pattern 22A, is a region serving as the transmission region S in the repeating pattern (line-and-space pattern) of the first LS pattern 22A, and is a region obtained by extending the transmission region S outward from the end E of the first LS pattern 22A in the present embodiment. The auxiliary film 41 disposed in the inversion region R1 has an effect of suppressing noise due to scattered light generated near the end E.

Figure 8:
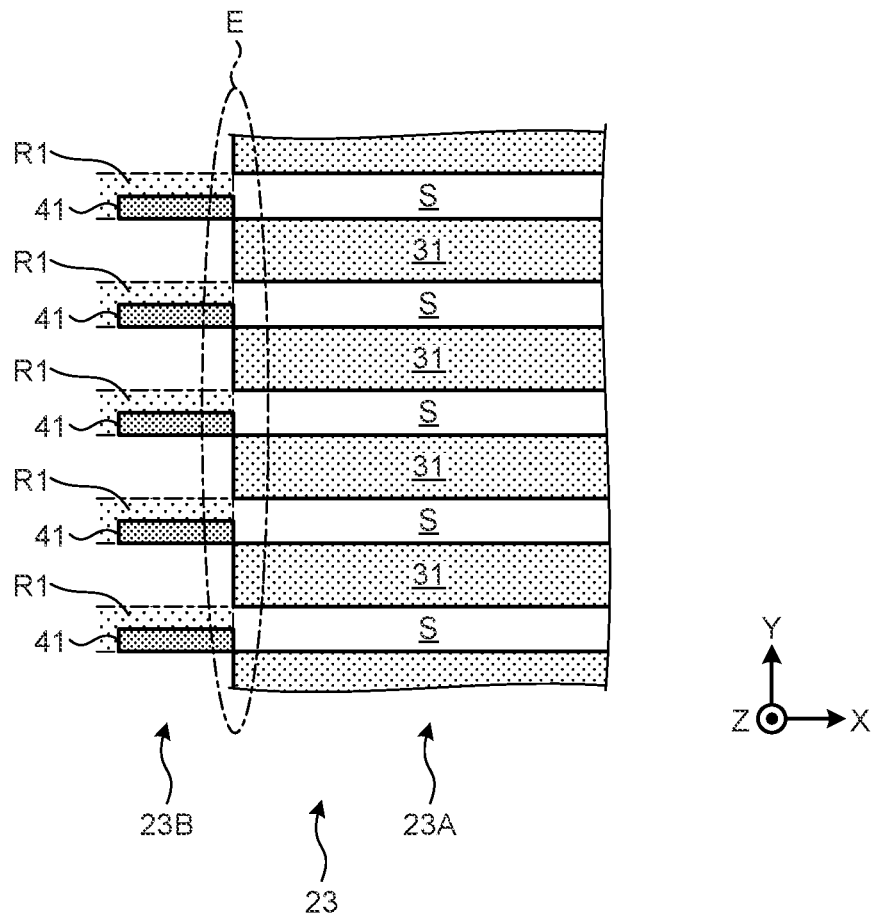
FIG. 8 is a partially enlarged top view illustrating an example of a configuration of a second LS pattern and a second LS auxiliary pattern according to the first embodiment.

FIG. 8 is a partially enlarged top view illustrating an example of a configuration of the second LS pattern 23A and the second LS auxiliary pattern 23B according to the first embodiment. The second LS pattern 23A and the second LS auxiliary pattern 23B have the same configuration as that obtained by rotating the first LS pattern 22A and the first LS auxiliary pattern 22B by 90° on an XY plane.

Figure 9:
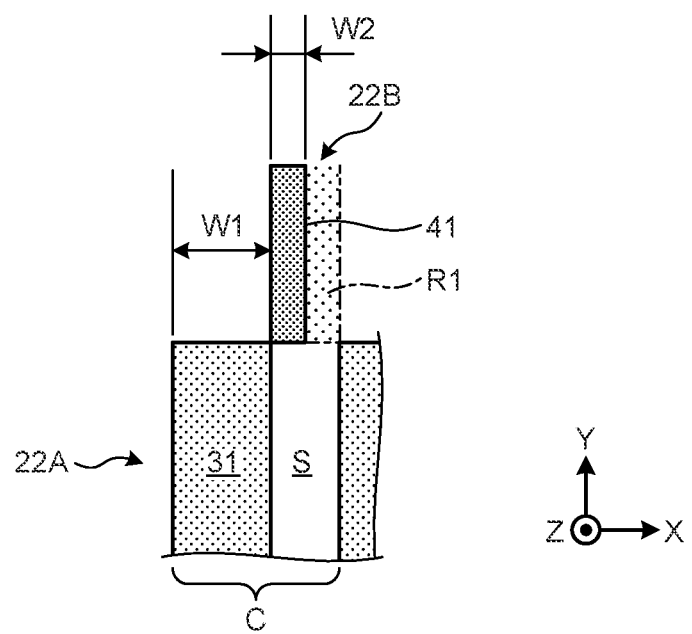
FIG. 9 is a partially enlarged top view illustrating an example of a configuration of the auxiliary film of a first LS auxiliary pattern according to a first embodiment.

A configuration and an action and effect of the first LS auxiliary pattern 22B will be described below. FIG. 9 is a partially enlarged top view illustrating an example of a configuration of the auxiliary film 41 of the first LS auxiliary pattern 22B according to the first embodiment. FIG. 9 illustrates a configuration for one cycle C in a line-and-space pattern including repetition of the reflective films 31 and the transmission regions S.

As illustrated FIG. 9, when a width of the auxiliary films 41 in the X-axis direction (extending direction of the end E or an inspection direction of shift) is set to W2, and a width of the reflective films 31 in the X-axis direction is set to W1, a relationship of W2<W1 holds. In other words, the width of the reflective films 31 is greater than the width of the auxiliary films 41. In addition, it is preferable that a relationship of 0<W2<W1/2 holds. In other words, the width of the auxiliary films 41 is greater than 0 and less than half of the width of the reflective films 31.

Figure 10:
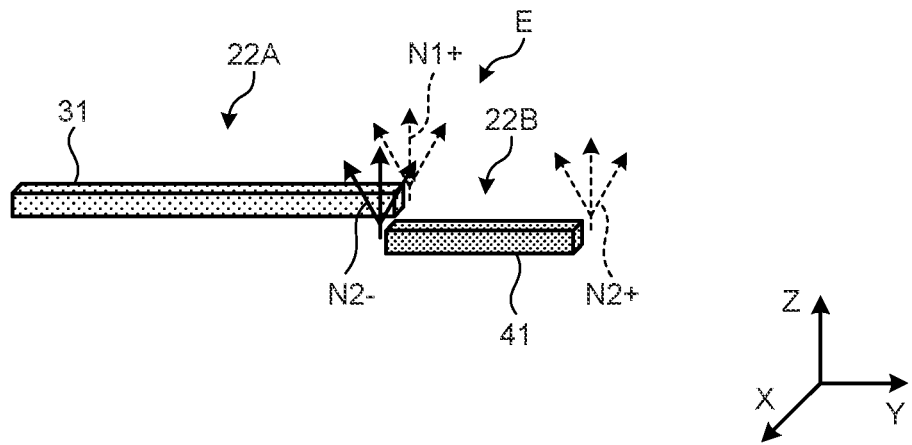
FIG. 10 is a conceptual diagram illustrating an example of an action and effect of the auxiliary films of the first LS auxiliary pattern according to the first embodiment.

FIG. 10 is a conceptual diagram illustrating an example of an action and effect of the auxiliary films 41 of the first LS auxiliary pattern 22B according to the first embodiment. When the first alignment mark 22 having the above configuration is irradiated with inspection light, noise N1+ is generated at the end E of the reflective film 31 included in the first LS pattern 22A as illustrated in FIG. 10. In addition, noise N2− is generated at one end of the auxiliary film 41 (the end on the reflective film 31 side) included in the first LS auxiliary pattern 22B, and noise N2+ is generated at the other end of the auxiliary film 41 (the end opposite to the end on the reflective film 31 side).

In this instance, the phase of the noise N2− at the one end of the auxiliary film 41 is 1800 inverted with respect to the phase of the noise N1+ of the reflective film 31 according to the principle of Babinet. In this way, the noise N1+ of the reflective film 31 and the noise N2− at the one end of the auxiliary film 41 are attenuated from each other. Further, the intensity of the noise N2+ at the other end of the auxiliary film 41 is smaller than the intensity of the noise N1+ of the reflective film 31. In this way, the intensity of noise generated near the end E can be weakened.

Note that the configuration and the action and effect of the first LS auxiliary pattern 22B of the first alignment mark 22 have been described. However, the description is similarly applied to the second LS auxiliary pattern 23B of the second alignment mark 23.

Further, the above description illustrates the case where the "first part" and the "third part" are the parts that reflect inspection light (reflective film 31 and auxiliary film 41), and the "second part" is a part that transmits inspection light (transmission region S). However, the embodiment is not limited thereto, and the "first part" and the "third part" may be parts that transmit inspection light, and the "second part" may be a part that reflects inspection light.

<Configuration Example of Checkered Auxiliary Pattern>

Figure 11:
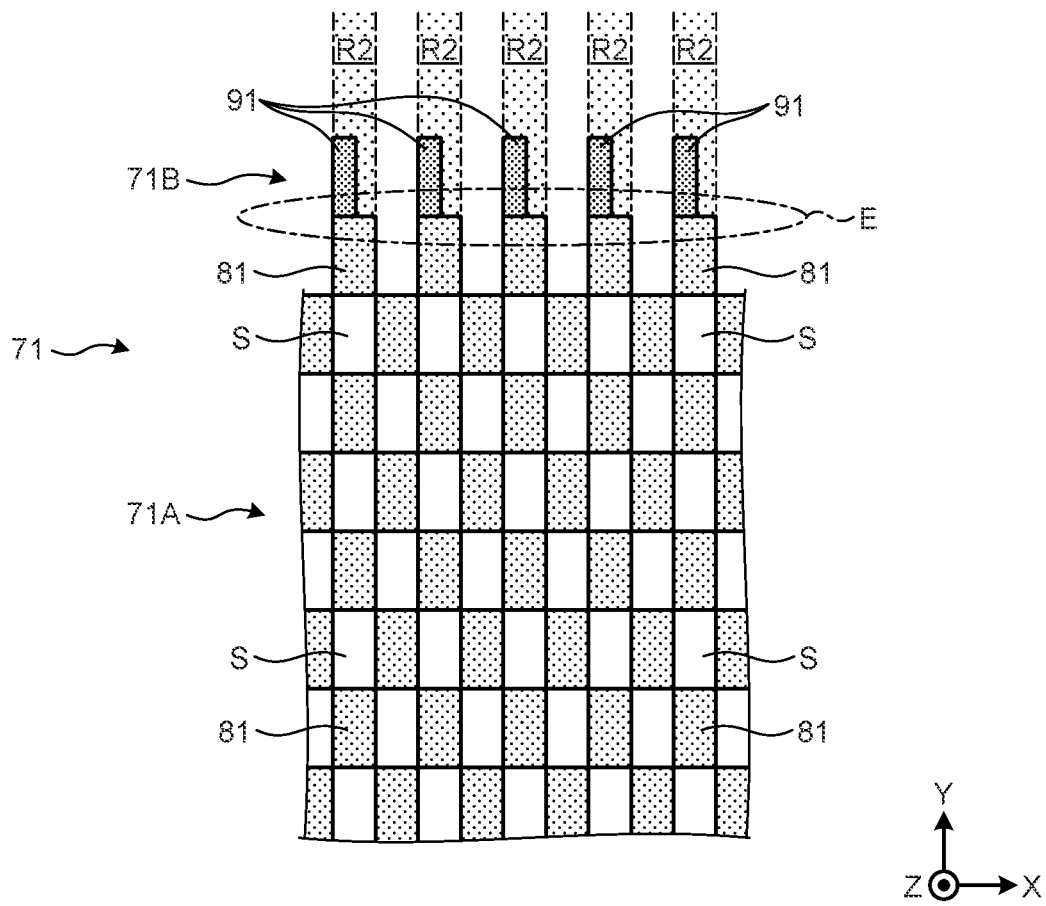
FIG. 11 is a partially enlarged top view illustrating an example of a configuration of a checkered pattern and a checkered auxiliary pattern according to the first embodiment.

FIG. 11 is a partially enlarged top view illustrating an example of a configuration of the checkered pattern 71A and the checkered auxiliary pattern 71B according to the first embodiment. As illustrated in FIG. 11, the checkered pattern 71A included in the main part of the alignment mark 71 formed on the wafer 51 (see FIG. 3) is configured by disposing a plurality of rectangular reflective films 81 (an example of a fourth part) disposed in a checkered shape. A plurality of transmission regions S (an example of a fifth part) through which inspection light is transmitted is formed between the plurality of reflective films 81. The checkered pattern 71A is disposed in the X-axis direction and the Y-axis direction in the first period (also referred to as a repeating pattern or a structural period) including the reflective film 81 and the transmission region S.

The checkered auxiliary pattern 71B is configured as a pattern opposite to the repeating pattern of the checkered pattern 71A in a region outside an end E of the checkered pattern 71A. The checkered auxiliary pattern 71B according to the present embodiment is configured by disposing a plurality of auxiliary films 91 (an example of a sixth part) in a plurality of inversion regions R2, respectively. The auxiliary films 91 include a material that reflects inspection light similarly to the reflective films 81, and may include the same material as that of the reflective films 81, or include a material different from that of the reflective films 81. The inversion region R2 is a region outside the end E of the checkered pattern 71A, is a region serving as the transmission region S in the repeating pattern (checkered shape pattern) of the checkered pattern 71A, and is a region obtained by extending a region in which the reflective film 81 is disposed outward from the end E in the present embodiment. Each of the auxiliary films 91 disposed in the inversion region R2 has an effect of suppressing noise due to scattered light generated near the end E. The checkered auxiliary pattern 71B is arranged in the X-axis direction in a second period (structural period) including a region between an auxiliary film 91 and an adjacent auxiliary film 91. The second period in the X-axis direction may have the same pitch as that of the first period.

As described above, according to the present embodiment, it is possible to suppress noise generated near the ends E of the alignment marks 22, 23, and 71 by the auxiliary patterns 22B, 23B, and 71B formed by disposing the auxiliary films 41 and 91 in the inversion regions R1 and R2 where the transmission region S needs to be originally disposed. Thereby, the accuracy of alignment can be improved.

Hereinafter, other embodiments will be described with reference to the drawings. However, the same or similar parts as those of the first embodiment are designated by the same reference symbols and the description thereof will be omitted.

Second Embodiment

Figure 12:
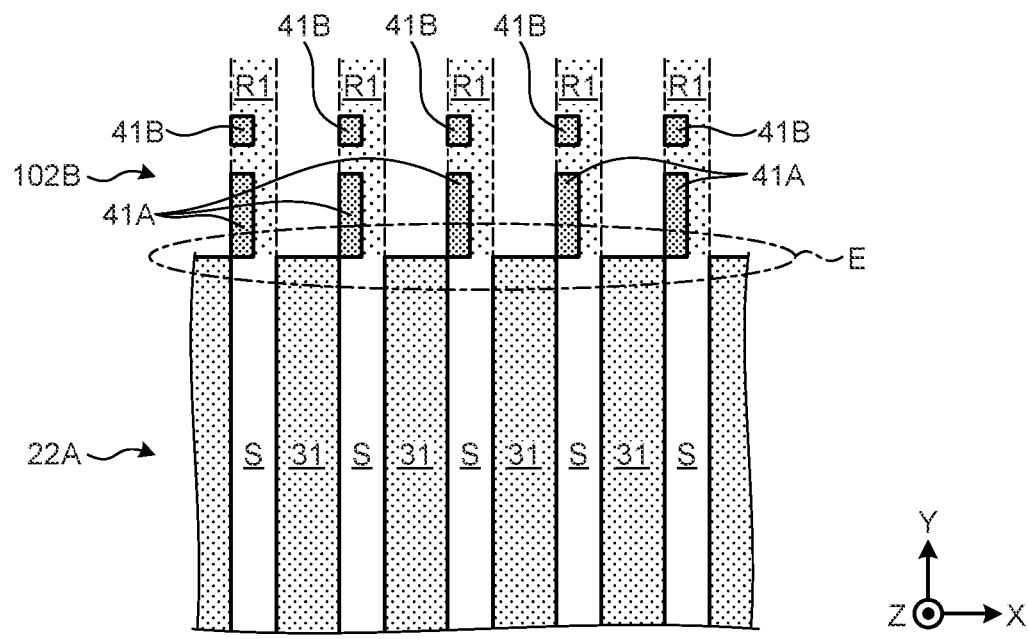
FIG. 12 is a partially enlarged top view illustrating an example of a configuration of a first LS pattern and a first LS auxiliary pattern according to a second embodiment.

FIG. 12 is a partially enlarged top view illustrating an example of a configuration of a first LS pattern 22A and a first LS auxiliary pattern 102B according to a second embodiment. The first LS auxiliary pattern 102B according to the present embodiment is configured by disposing a plurality of (two in this example) auxiliary films 41A and 41B in one inversion region R1.

The auxiliary films 41A have a similar configuration to that of the auxiliary films 41 according to the first embodiment. The auxiliary films 41B are disposed at positions separated from the auxiliary films 41A by a predetermined distance along the Y-axis direction. Further, the area of the auxiliary film 41B in a plan view is smaller than that of the auxiliary film 41A. The auxiliary film 41B has an effect of suppressing noise due to scattered light generated at an end of the auxiliary film 41A opposite to an end on the reflective film 31 side.

With the above configuration, it is possible to suppress noise generated near the end E as compared with the first embodiment.

Third Embodiment

Figure 13:
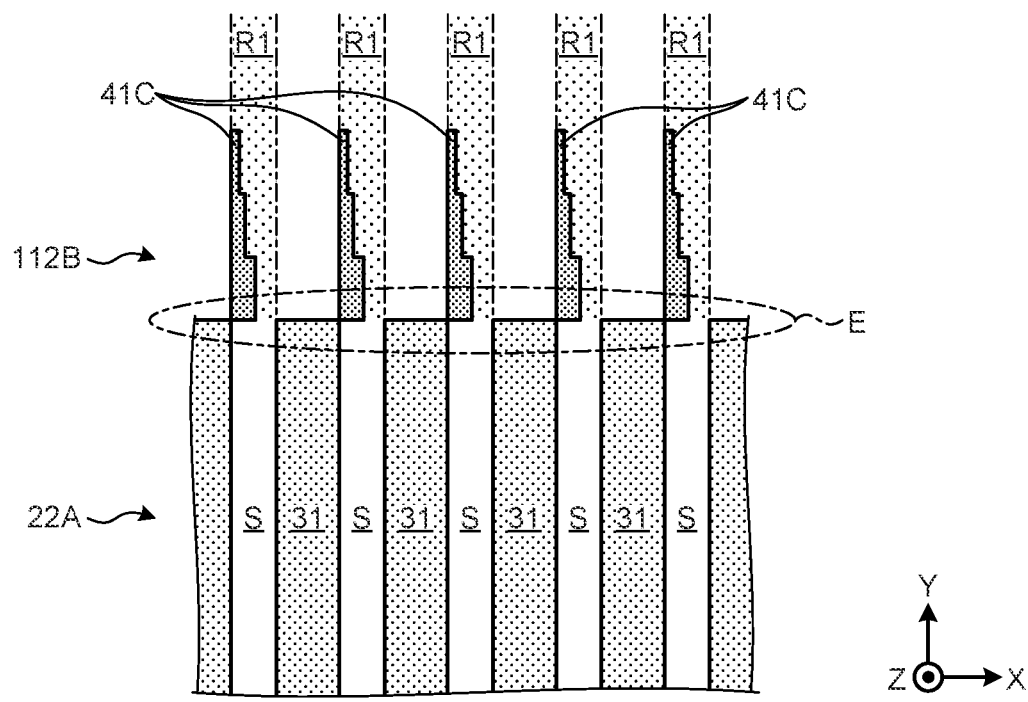
FIG. 13 is a partially enlarged top view illustrating an example of a configuration of a first LS pattern and a first LS auxiliary pattern according to a third embodiment.

FIG. 13 is a partially enlarged top view illustrating an example of a configuration of a first LS pattern 22A and a first LS auxiliary pattern 112B according to a third embodiment. The first LS auxiliary pattern 112B according to the present embodiment is configured by disposing an auxiliary film 41C whose width (W2 in FIG. 9) in the X-axis direction (inspection direction of shift) decreases as a distance from the reflective film 31 increases in each inversion region R1.

With the above configuration, it is possible to suppress generation of scattered light at the end of the auxiliary film 41C opposite to the end on the reflective film 31 side, and to suppress noise generated near the end E as compared with the first embodiment.

Fourth Embodiment

Figure 14:
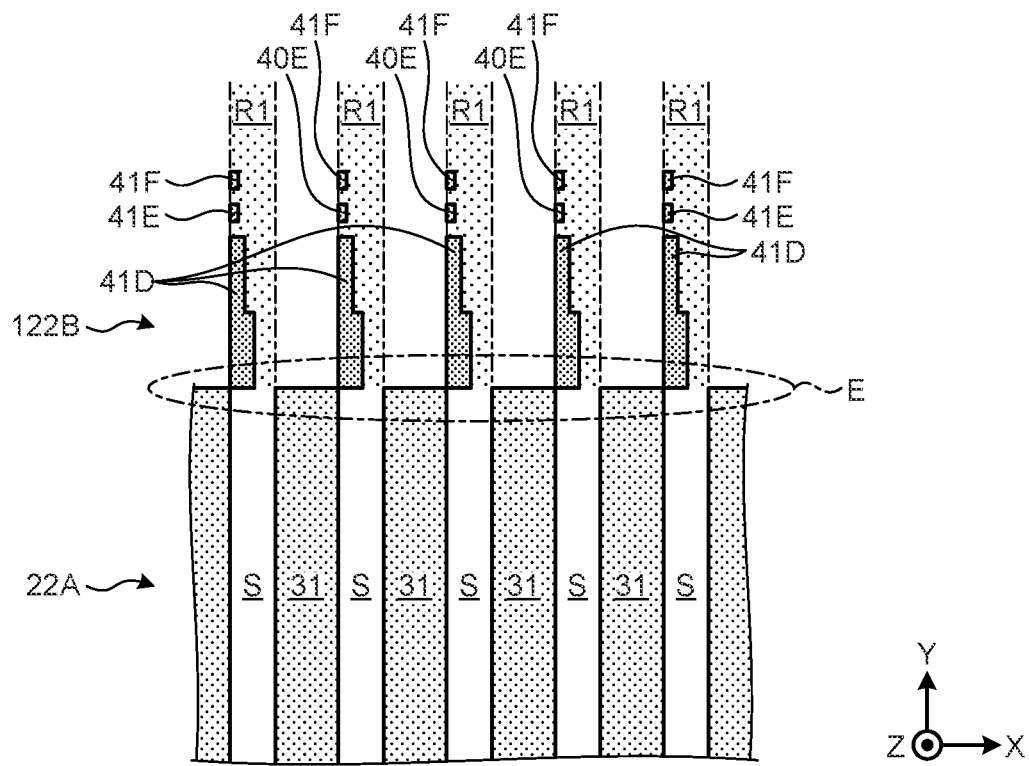
FIG. 14 is a partially enlarged top view illustrating an example of a configuration of a first LS pattern and a first LS auxiliary pattern according to a fourth embodiment.

FIG. 14 is a partially enlarged top view illustrating an example of a configuration of a first LS pattern 22A and a first LS auxiliary pattern 122B according to a fourth embodiment. The first LS auxiliary pattern 122B according to the present embodiment is configured by disposing three auxiliary films 41D, 41E, and 41F in each inversion region R1.

A width (W2 in FIG. 9) of the auxiliary film 41D in the X-axis direction (inspection direction of shift) decreases as a distance from the reflective film 31 increases. The auxiliary films 41E are disposed at positions separated from the auxiliary films 41D by a predetermined distance along the Y-axis direction. The auxiliary films 41F are disposed at positions separated from the auxiliary films 41E by a predetermined distance along the Y-axis direction. The area of each of the auxiliary films 41E and 41F in a plan view is smaller than that of the auxiliary film 41D.

With the above configuration, it is possible to suppress generation of scattered light at the end of the auxiliary film 41D opposite to the end on the reflective film 31 side, and to suppress noise generated near the end E as compared with the first embodiment.

Fifth Embodiment

Figure 15:
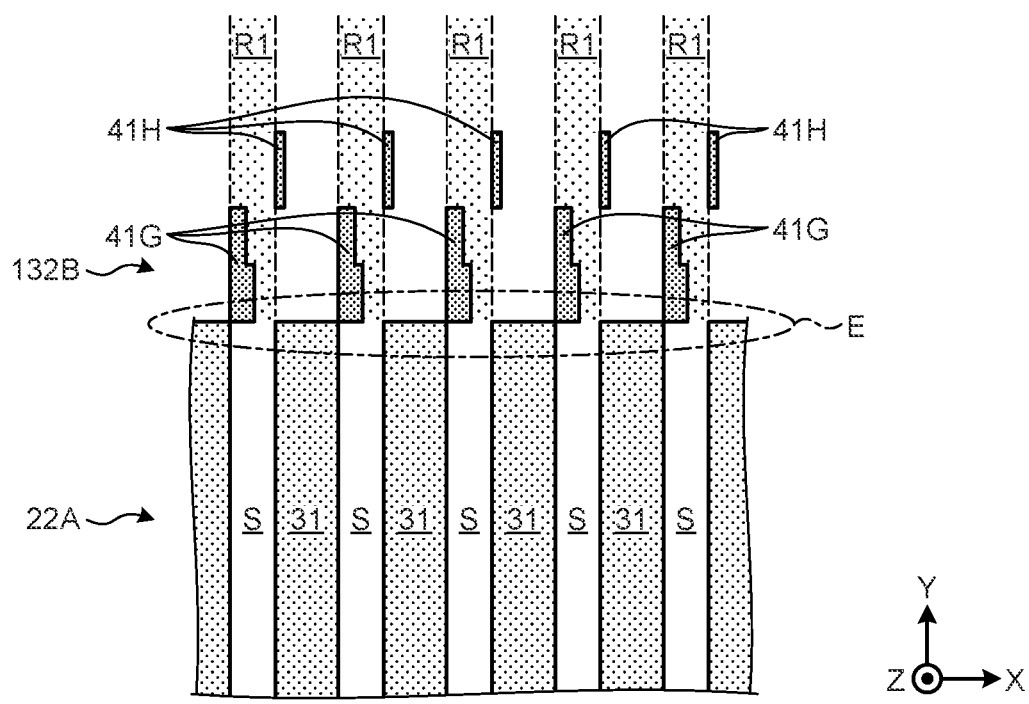
FIG. 15 is a partially enlarged top view illustrating an example of a configuration of a first LS pattern and a first LS auxiliary pattern according to a fifth embodiment.

FIG. 15 is a partially enlarged top view illustrating an example of a configuration of a first LS pattern 22A and a first LS auxiliary pattern 132B according to a fifth embodiment. The first LS auxiliary pattern 132B according to the present embodiment is configured by disposing auxiliary films 41G in respective inversion regions R1 and disposing auxiliary films 41H in regions between the respective inversion regions R1.

A width (W2 in FIG. 9) of the auxiliary film 41G in the X-axis direction (inspection direction of shift) decreases as a distance from the reflective film 31 increases. The auxiliary films 41H are disposed at positions separated from the auxiliary films 41G by a predetermined distance on the XY plane. The area of each of the auxiliary films 41H in a plan view is smaller than that of each of the auxiliary films 41G. The auxiliary film 41H is at the same position as that of the reflective film 31 in the Y-axis direction, and has an opposite pattern to that of the auxiliary film 41G.

With the above configuration, it is possible to further suppress generation of scattered light at the end of the auxiliary film 41G opposite to the end on the reflective film 31 side by the auxiliary film 41H, and to suppress noise generated near the end E as compared with the first embodiment.

Sixth Embodiment

Figure 16:
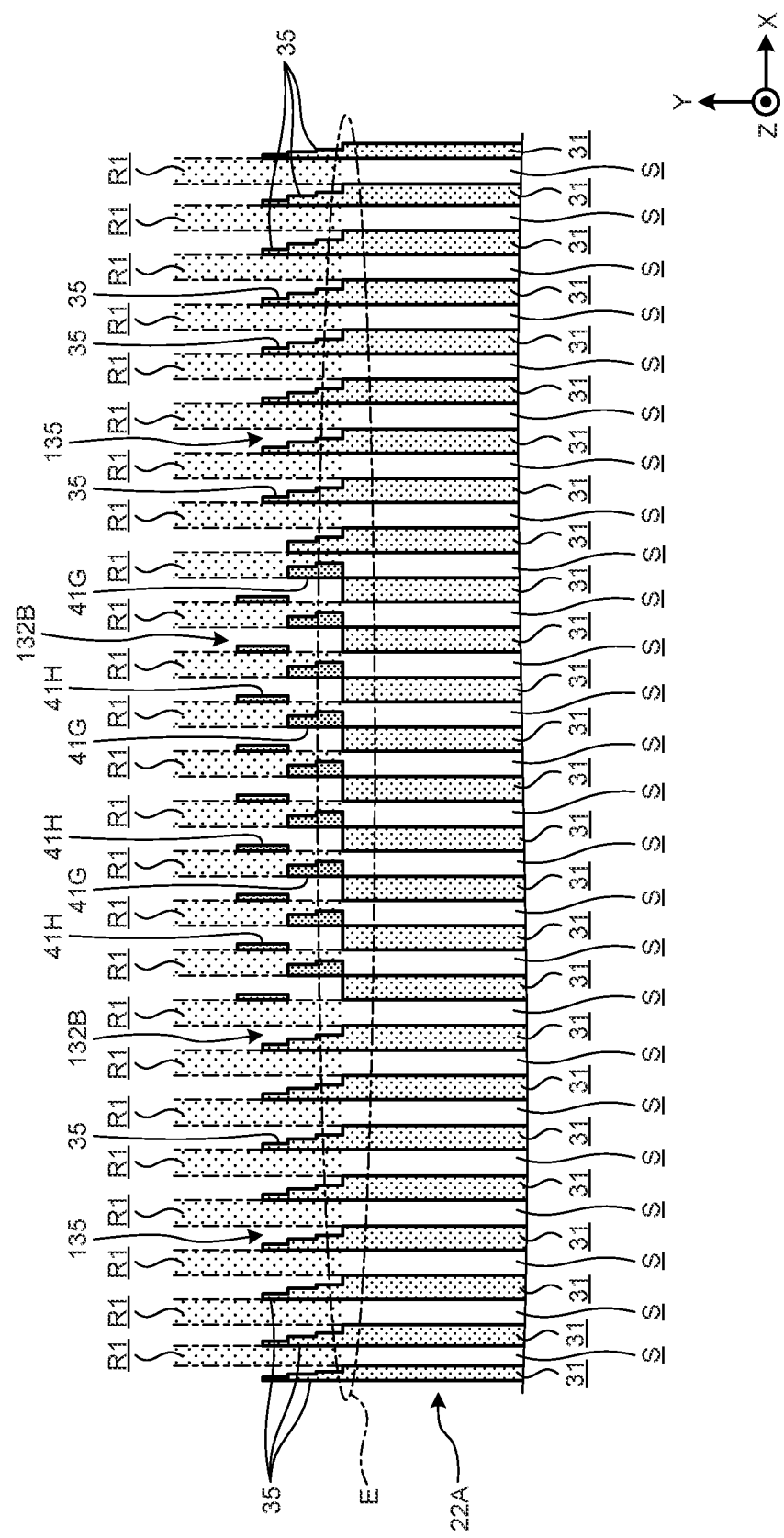
FIG. 16 is a partially enlarged top view illustrating an example of a configuration of a first LS pattern and a first LS auxiliary pattern according to a sixth embodiment.

FIG. 16 is a partially enlarged top view illustrating an example of a configuration of a first LS pattern 22A and a first LS auxiliary pattern 142B according to a sixth embodiment. In the present embodiment, the first LS auxiliary pattern 132B according to the fifth embodiment and an LS pattern 135 in which the auxiliary pattern is not formed in the transmission region S are used in combination. At each end of the reflective films 31 of the LS pattern 135 illustrated here, a stepped portion 35 whose width in the X-axis direction becomes smaller as the distance from the end is increased is formed. Furthermore, in the configuration illustrated here, the first LS auxiliary pattern 132B is disposed in center portion in the X-axis direction, and the LS patterns 135 are disposed in both side portions of the first LS auxiliary pattern 132B.

As described above, even when the first LS auxiliary pattern 132B and the LS pattern 135 in which the auxiliary pattern is not formed are used in combination, the effect of suppressing the noise generated near the end portion E can be obtained. Furthermore, since the noise suppression effect in the center portion of the end portion E in the X-axis direction is higher than that at the both side portions, the noise suppression effect in the entire end portion E can be uniformized.

Seventh Embodiment

Figure 17:
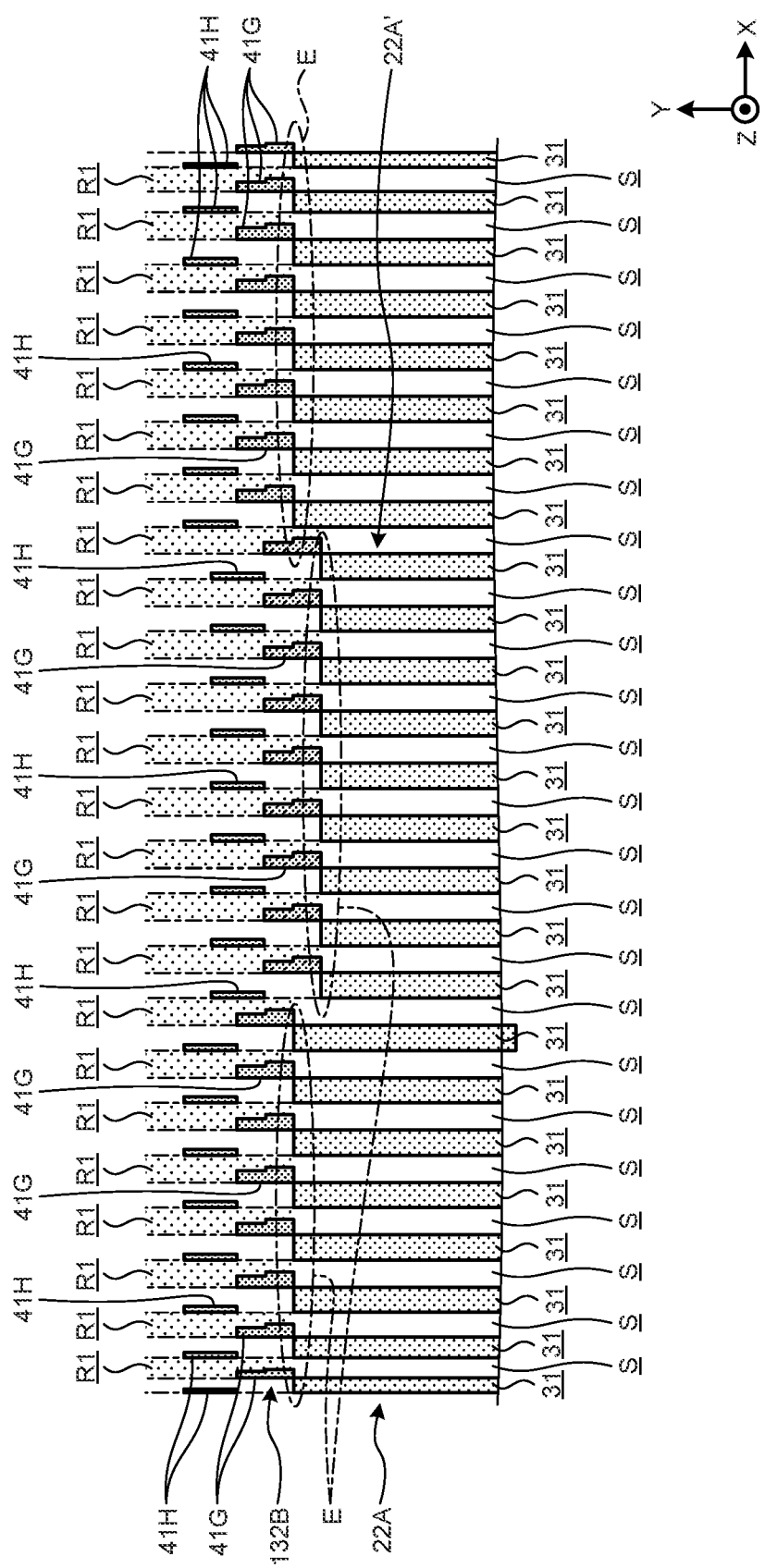
FIG. 17 is a partially enlarged top view illustrating an example of a configuration of a first LS pattern and a first LS auxiliary pattern according to a seventh embodiment.

FIG. 17 is a partially enlarged top view illustrating an example of a configuration of a first LS pattern 22A and a first LS auxiliary pattern 132B according to a seventh embodiment. Although the first LS pattern 22A and the first LS auxiliary pattern 132B according to the seventh embodiment have a basically same configuration as the fifth embodiment (see FIG. 15), the first LS pattern 22A according to the seventh embodiment includes a shortened LS pattern 22A' in which an extension direction of the reflective film 31 and the transmission regions S is shorter than the other portions in the LS pattern 22A.

Even with the above configuration, the effect of suppressing the noise generated near the end portion E can be obtained. Furthermore, since the noise suppression effect in the center portion of the end portion E in the X-axis direction is higher than that at the both side portions, the noise suppression effect in the entire end portion E can be uniformized.

Eighth Embodiment

Figure 18:
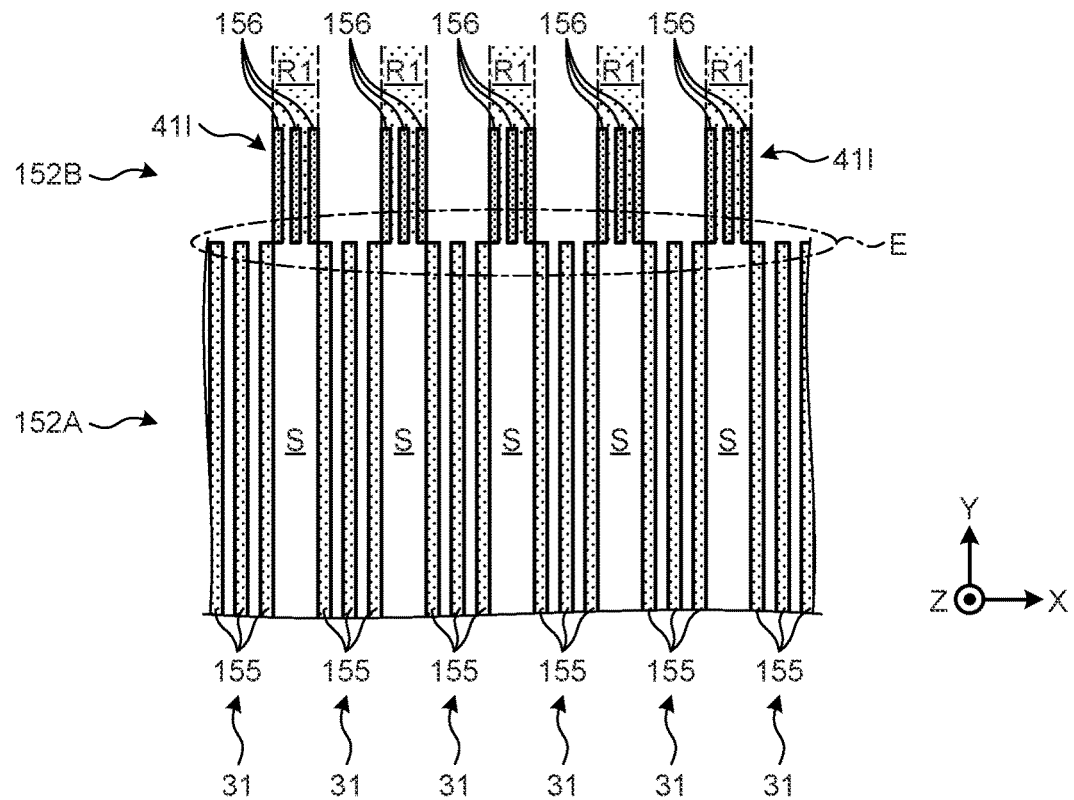
FIG. 18 is a partially enlarged top view illustrating an example of a configuration of a first LS pattern and a first LS auxiliary pattern according to an eighth embodiment.

FIG. 18 is a partially enlarged top view illustrating an example of a configuration of a first LS pattern 152A and a first LS auxiliary pattern 152B according to an eighth embodiment. A reflective film 31 of the first LS pattern 152A according to the present embodiment includes a plurality of (three in this example) linear films 155 parallel to the Y-axis. Further, an auxiliary film 41I of the first LS auxiliary pattern 152B according to the present embodiment includes a plurality of (three in this example) linear films 156 parallel to the Y-axis. Note that each of the plurality of films 156 included in the auxiliary film 41I may have configurations illustrated in the second to fifth embodiments (FIGS. 12 to 15).

Even with the above configuration, noise generated near the end E can be suppressed by the action of the auxiliary film 41I disposed in the inversion region R1.

Ninth Embodiment

Figure 19:
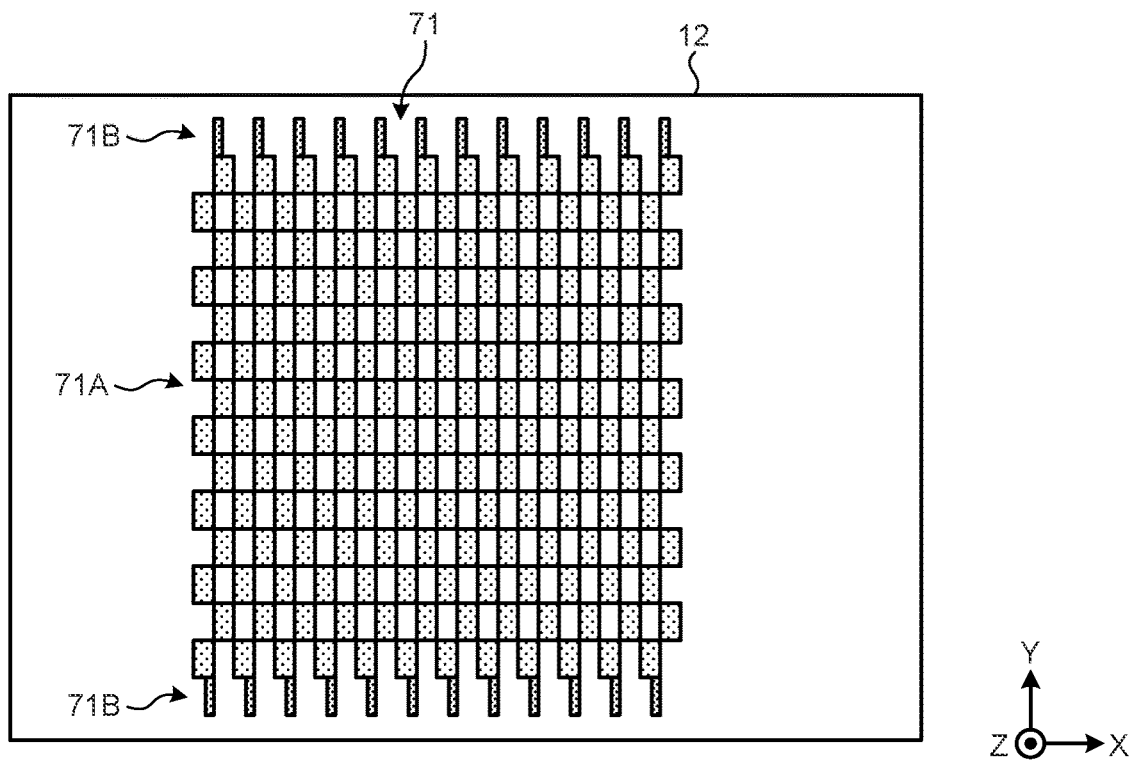
FIG. 19 is a partially enlarged top view illustrating an example of a configuration of an alignment region of a template according to a ninth embodiment.
Figure 20:
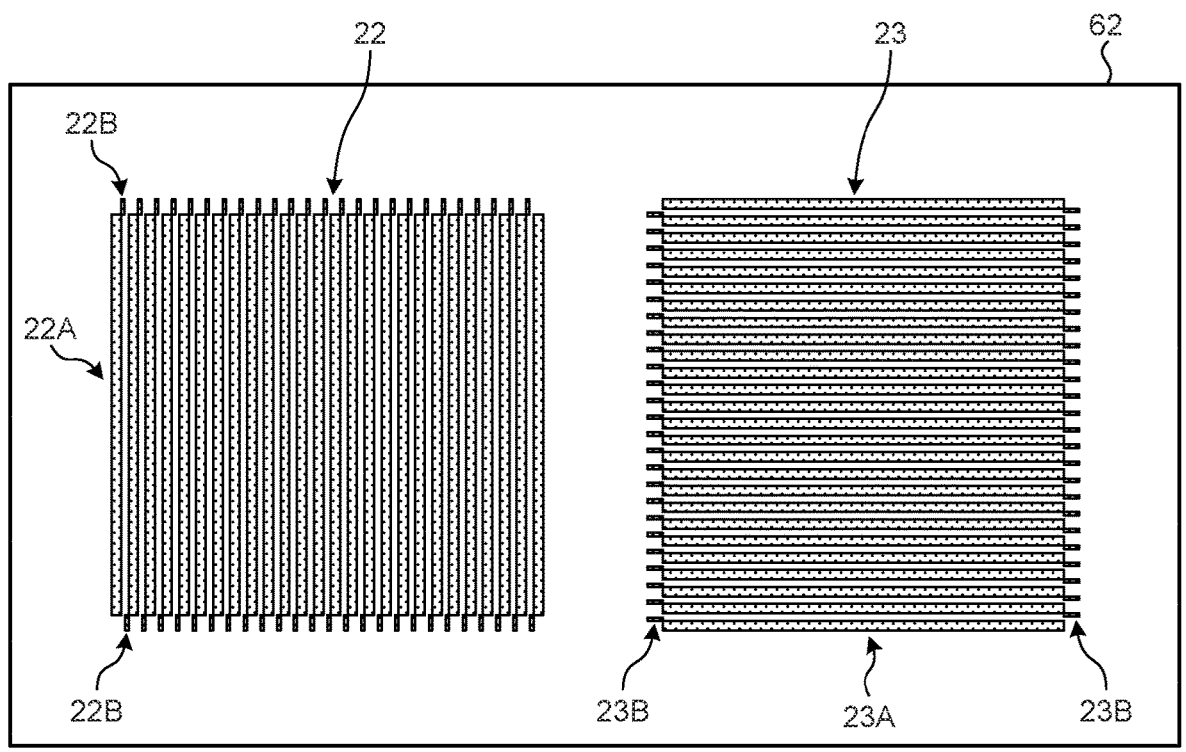
FIG. 20 is a partially enlarged top view illustrating an example of a configuration of an alignment region of a wafer according to the ninth embodiment.

FIG. 19 is a partially enlarged top view illustrating an example of a configuration of an alignment region 12 of a template 1 according to a ninth embodiment. FIG. 20 is a partially enlarged top view illustrating an example of a configuration of an alignment region 62 of a wafer 51 according to the ninth embodiment.

As illustrated in FIG. 19, an alignment mark 71 including a checkered pattern 71A and a checkered auxiliary pattern 71B is formed in the alignment region 12 of the template 1 according to the present embodiment. Further, as illustrated in FIG. 20, a first alignment mark 22 including a first LS pattern 22A and a first LS auxiliary pattern 22B, and a second alignment mark 23 including a second LS pattern 23A and a second LS auxiliary pattern 23B are formed in the alignment region 62 of the wafer 51 according to the present embodiment.

The first embodiment illustrates a configuration in which line-and-space alignment marks 22 and 23 are formed in the alignment region 12 of the template 1 and the checkered shape alignment mark 71 is formed in the alignment region 62 of the wafer 51. However, as in the present embodiment, the checkered shape alignment mark 71 may be formed in the alignment region 12 of the template 1, and the line-and-space alignment marks 22 and 23 may be formed in the alignment region 62 of the wafer 51.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A template comprising:
   an alignment mark,
   wherein the alignment mark includes a first main pattern in which a first part and a second part are disposed in at least a first direction as a predetermined repeating pattern and a first auxiliary pattern in which the first part and the second part are configured as a pattern opposite to the repeating pattern in a region outside an end of the first main pattern in a second direction intersecting the first direction,
   the first auxiliary pattern includes a third part in a region corresponding to the second part, and
   in the second direction of the alignment mark, a phase of noise at the end of the first part of the first main pattern and a phase of noise at the end of the third part of the first auxiliary pattern are reversed by 180°.

2. The template according to claim 1,
   wherein the first part is a part reflecting inspection light,
   the second part is a part transmitting the inspection light, and
   the third part is a part reflecting the inspection light.

3. The template according to claim 2,
wherein when a width of the third part in an extending direction of the end is set to W2, and a width of the first part in the extending direction of the end is set to W1, a relationship of W2<W1 holds.

4. The template according to claim 3, wherein a relationship of W2<W1/2 holds.

5. The template according to claim 3,
wherein the width W2 decreases as a distance from the first part increases.

6. The template according to claim 2,
wherein a plurality of third parts is disposed in one inversion region.

7. The template according to claim 2,
wherein one first part includes a plurality of linear films, and
one third part includes a plurality of linear films.

8. The template according to claim 1,
wherein the repeating pattern is a line-and-space pattern.

9. The template according to claim 1,
wherein the repeating pattern is a checkered shape.

10. A workpiece processed by an imprint process using a template, the workpiece comprising:
an alignment mark for alignment with the template,
wherein the alignment mark includes a second main pattern in which a fourth part and a fifth part are disposed in at least a first direction as a predetermined repeating pattern and a second auxiliary pattern in which the fourth part and the fifth part are configured as a pattern opposite to the repeating pattern in a region outside an end of the second main pattern in a second direction intersecting the first direction,
the second auxiliary pattern includes a sixth part in a region corresponding to the fifth part, and
in the second direction of the alignment mark, a phase of noise at the end of the fourth part of the second main pattern and a phase of noise at the end of the sixth part of the second auxiliary pattern are reversed by 180°.

11. The workpiece according to claim 10, wherein the fourth part is a part reflecting
inspection light,
the fifth part is a part transmitting the inspection light, and
the sixth part is a part reflecting the inspection light.

12. The workpiece according to claim 11,
wherein when a width of the sixth part in an extending direction of the end is set to W2, and a width of the fourth part in the extending direction of the end is set to W1, a relationship of W2<W1 holds.

13. The workpiece according to claim 12, wherein a relationship of W2<W1/2 holds.

14. The workpiece according to claim 12,
wherein the width W2 decreases as a distance from the fourth part increases.

15. The workpiece according to claim 11,
wherein a plurality of sixth parts is disposed in one inversion region.

16. The workpiece according to claim 11,
wherein one fourth part includes a plurality of linear films, and
one sixth part includes a plurality of linear films.

17. The workpiece according to claim 10,
wherein the repeating pattern is a line-and-space pattern.

18. The workpiece according to claim 10,
wherein the repeating pattern is a checkered shape.

19. An alignment method comprising:
setting a template on which an alignment mark is formed and a workpiece on which an alignment mark is formed so that the template and the workpiece face each other;
emitting inspection light from a side of the template;
acquiring moire information related to a moire generated by irradiation with the inspection light; and
adjusting a relative position of the template and the workpiece based on the moire information,
wherein the alignment mark of the template includes a first main pattern in which a first part and a second part are disposed in at least a first direction as a predetermined first repeating pattern and a first auxiliary pattern in which the first part and the second part are configured as a pattern opposite to the first repeating pattern in a region outside an end of the first main pattern in a second direction intersecting the first direction,
the first auxiliary pattern includes a third part in a region corresponding to the second part,
in the second direction of the alignment mark of the template, a phase of noise at the end of the first part of the first main pattern and a phase of noise at the end of the third part of the first auxiliary pattern are reversed by 180°,
the alignment mark of the workpiece includes a second main pattern in which a fourth part and a fifth part are disposed in at least the [MY1] first direction as a predetermined second repeating pattern and a second auxiliary pattern in which the fourth part and the fifth part are configured as a pattern opposite to the second repeating pattern in a region outside an end of the second main pattern, in the [MY2] second direction intersecting the first direction,
the second auxiliary pattern includes a sixth part in a region corresponding to the fifth part, and
in the second direction of the alignment mark of the workpiece, a phase of noise at the end of the fourth part of the second main pattern and a phase of noise at the end of the sixth part of the second auxiliary pattern are reversed by 180°.

20. The alignment method according to claim 19,
wherein the first part and the fourth part are parts reflecting inspection light,
the second part and the fifth part are parts transmitting the inspection light,
the third part and the sixth part are parts reflecting the inspection light.

* * * * *